(12) United States Patent
Baranwal et al.

(10) Patent No.: US 9,142,322 B2
(45) Date of Patent: Sep. 22, 2015

(54) MEMORY MANAGER

(71) Applicant: STMicroelectronics International N.V., Amsterdam (NL)

(72) Inventors: Deepak Baranwal, Greater Noida (IN); Digvijay Pratap Singh, Greater Noida (IN); Kaushik Saha, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 92 days.

(21) Appl. No.: 13/964,299

(22) Filed: Aug. 12, 2013

(65) Prior Publication Data
US 2014/0047285 A1 Feb. 13, 2014

(30) Foreign Application Priority Data
Aug. 10, 2012 (IN) ............... 2506DEL2012

(51) Int. Cl.
*G11C 29/00* (2006.01)
*G11C 29/08* (2006.01)
*G11C 29/04* (2006.01)

(52) U.S. Cl.
CPC .............. *G11C 29/08* (2013.01); *G11C 29/04* (2013.01); *G11C 29/76* (2013.01); *G11C 2029/0409* (2013.01)

(58) Field of Classification Search
CPC .............. G11C 29/08; G11C 29/76; G11C 2029/0409; G11C 29/04; G11C 7/04; G11B 20/18; G01K 3/005
See application file for complete search history.

(56) References Cited

U.S. PATENT DOCUMENTS

| | | | |
|---|---|---|---|
| 7,103,746 B1* | 9/2006 | Kulick | 711/173 |
| 2003/0046020 A1* | 3/2003 | Scheuerlein | 702/132 |
| 2006/0007739 A1* | 1/2006 | Takeda et al. | 365/185.09 |
| 2008/0130156 A1* | 6/2008 | Chu et al. | 360/71 |
| 2010/0199149 A1* | 8/2010 | Weingarten et al. | 714/773 |
| 2011/0066902 A1* | 3/2011 | Sharon et al. | 714/721 |
| 2011/0113303 A1* | 5/2011 | Bedeschi et al. | 714/763 |
| 2013/0061101 A1* | 3/2013 | Fitzpatrick et al. | 714/718 |

* cited by examiner

Primary Examiner — Guerrier Merant
(74) Attorney, Agent, or Firm — Seed IP Law Group PLLC

(57) ABSTRACT

An embodiment of a manager includes at least one input node configured to receive information regarding a region of an integrated circuit, and a determiner configured to determine, in response to the information, a likelihood that the region will cause an error. For example, the region may include a memory, and contents of the memory may be transferred to another, more reliable memory, if the likelihood that the memory will cause an error in the data that it stores equals or exceeds a likelihood threshold.

25 Claims, 8 Drawing Sheets

| At time= | Vin= | nPin= | pPin= | Tin= | f[]out= | |
|---|---|---|---|---|---|---|
| 0s | 0 | 0 | 0 | 0 | 0 | ⎫ |
| 1μ | 1.28 | -0.1 | 0.1 | 25 | 0 | ⎬ Reliable |
| 2μ | 1.25 | -1.2 | 1.2 | 32 | 0 | |
| 3μ | 1.21 | -1.7 | 1.5 | 40 | 0 | ⎭ |
| 4μ | 1.1 | -2 | 3 | 60 | 1 | ⎫ Less |
| 5μ | 1.05 | -2.5 | 2 | 65 | 1 | ⎬ Reliable |
| 6μ | 1 | -2.8 | 1 | 74 | 1 | ⎭ |
| 7μ | 0.9 | 1 | -2 | 110 | 2 | ⎫ Un |
| 8μ | 0.8 | 1.2 | -2.5 | 125 | 2 | ⎬ Reliable |
| 9μ | 0.7 | 2 | -3 | 140 | 2 | ⎭ |

NOTE: (f_out ---> indication)
0 Reliable      1 Less Reliable      2 Unreliable

MEMORY MANAGER

PRIORITY CLAIM

The instant application claims priority to Indian Patent Application No. 2506DEL2012, filed Aug. 10, 2012, which application is incorporated herein by reference in its entirety.

TECHNICAL FIELD

Embodiments relate to a memory manager and memory management methods.

SUMMARY

In System on Chips (SOCs), one or more memories may be provided. One or more of the memories or one or more parts of the memories may be unreliable. If a memory or memory part is unreliable, then the value which is in the memory or memory part may be incorrect. This may have an impact on the functionality and performance of the System on Chip.

Therefore, an embodiment of a memory manager includes: an input configured to receive sensor information from one or more sensors associated with at least one memory region; and a reliability module configured to determine a reliability of at least one memory region using said sensor information associated with said memory region and reliability information defining memory reliability under different conditions.

The reliability information defining memory reliability under different conditions may include at least one ranking table.

The reliability module may be configured to use a plurality of different types of sensor information and reliability information for each of said different types of sensor information.

The reliability module may be configured to compare each type of sensor information with the respective reliability information to provide a reliability output for each of said different types of sensor information and to use said reliability outputs for each of said different types of sensor information to provide said determined reliability.

At least one of said determined reliability and said reliability output for each of said different types of sensor information may include one of a relatively high reliability, a relatively low reliability, and an intermediate reliability.

The reliability module may be configured to provide said reliability output for each of said different types of sensor information including one of a relatively high reliability, a relatively low reliability, and an intermediate reliability, wherein at least one of said reliability outputs may include a plurality of subdivisions.

Reliability information defining memory reliability under different conditions may include one of pre-silicon characterization and post silicon characterization for a respective memory region.

The reliability module may be configured to cause a content of a first memory region for which said determined reliability is relatively low to be moved to a second different memory region.

The memory manager may include a direct memory access module configured to be controlled by said reliability module to move said content of said first memory region to said different memory region.

The reliability module may be configured to change a memory operating parameter for said respective memory region in dependence on said determined reliability.

The memory operating parameter may include at least one of voltage and frequency.

The sensor information may include one or more of process, voltage, and temperature information.

The reliability module may be configured to determine reliability also using usage information associated with said at least one memory region.

The at least one memory region may include at least one of a plurality of different memory regions of one memory and a plurality of different memories.

An arrangement may include the memory manager and said one or more sensors.

The arrangement may include said at least one memory region.

An integrated circuit may include the arrangement.

An embodiment of a memory manager includes: an input configured to receive sensor information from one or more sensors associated with at least one memory region; a reliability module configured to determine a reliability of at least one memory region using said sensor information, said reliability of a least one memory changing over time; and a memory access module configured to move a content of a memory region for which a determined reliability is relatively low to a different memory region.

An embodiment of a method includes: receiving sensor information from one or more sensors associated with at least one memory region; and determining a reliability of at least one memory region using said sensor information associated with said memory region and reliability information defining memory reliability under different conditions.

The reliability information defining memory reliability under different conditions may include at least one ranking table.

The determining of a reliability may use a plurality of different types of sensor information and reliability information for each of said different types of sensor information.

The determining a reliability may include comparing each type of sensor information with the respective reliability information to provide a reliability output for each of said different types of sensor information and using said reliability outputs for each of said different types of sensor information to provide said determined reliability.

At least one of said determined reliability and said reliability output for each of said different types of sensor information may include one of a relatively high reliability, a relatively low reliability, and an intermediate reliability.

The determining of a reliability may include providing said reliability output for each of said different types of sensor information including one of a relatively high reliability, a relatively low reliability, and an intermediate reliability, wherein at least one of said reliability outputs includes a plurality of subdivisions.

The reliability information defining memory reliability under different conditions may include one of pre-silicon characterization and post silicon characterization for a respective memory region.

The determining a reliability may include causing a content of a first memory region for which said determined reliability is relatively low to be moved to a second different memory region.

The method may further include moving said content of said first memory region to said different memory region, wherein said moving is controlled by said determined reliability.

The determining of a reliability may include changing a memory operating parameter for said respective memory region in dependence on said determined reliability.

The memory operating parameter may include at least one of voltage and frequency.

The sensor information may include one or more of process, voltage, and temperature information.

The determining of a reliability may include determining reliability also using usage information associated with said at least one memory region.

The at least one memory region may include at least one of a plurality of different memory regions of one memory and a plurality of different memories.

An embodiment of a method includes: receiving sensor information from one or more sensors associated with at least one memory region; determining a reliability of at least one memory region using said sensor information, said reliability of at least one memory changing over time; and moving a content of a memory region for which a determined reliability is relatively low to a different memory region.

BRIEF DESCRIPTION OF THE DRAWINGS

Reference will now be made by way of example only to the following accompanying drawings.

DETAILED DESCRIPTION OF ONE OR MORE EMBODIMENTS

Figure 1:
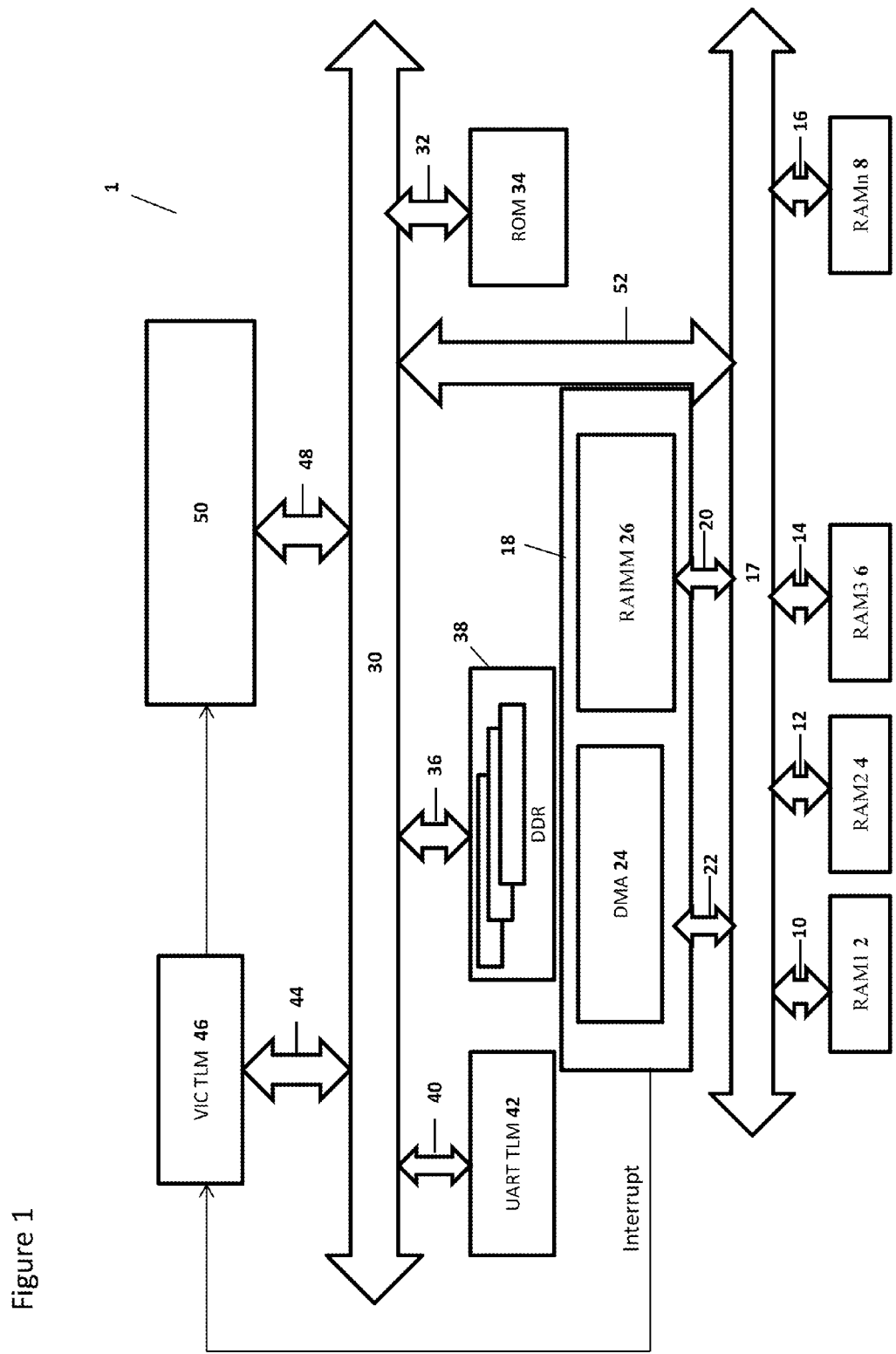
FIG. 1 shows a system in which embodiments may be provided.

Reference is made to FIG. 1, which shows one example of a system in which embodiments may be provided. The system 1 includes n random access memories RAM. The number of random access memories can be any suitable number. In some embodiments, n is 2 or more. In FIG. 1, the first RAM is referenced 2, the second RAM is referenced 4, the third RAM is referenced 6, and the nth RAM is referenced 8. Each RAM is coupled by a respective link 10, 12, 14 and 16 to an interconnect (e.g., a bus) 17. These RAMs will be discussed in more detail later. In some embodiments, this interconnect may be considered to be a secondary interconnect.

The system 1 includes a memory management module 18. The memory management module has a direct memory access DMA portion 24 and a reliability aware intelligent memory management RAIMM portion 26. The DMA portion 24 is coupled via a link 22 to the interconnect 17. Likewise the RAIMM portion 26 has a link 20 with the interconnect 17. In some embodiments, the RAIMM and the DMA portions may share a link to the secondary interconnect 17.

The system 1 further includes a main system interconnect (e.g., bus) 30. The main system interconnect 30 has a link 32 with a read only memory ROM 34. The main interconnect 30 has a link 36 with a double data rate DDR memory 38. The main interconnect 30 has a link 40 with a universal asynchronous receiver/transmitter UART block 42. The main interconnect also has a link 44 with a Vectored Interrupt Controller VIC block 46. The VIC is used for interrupt processing and to provide an interrupt vector. And the interconnect 30 has a link 48 to one or more CPUs 50.

The memory management module 18 is configured to provide interrupts to the VIC block 46 and from the VIC block 46 to the one or more CPUs 50.

A link 52 is provided between the main interconnect 30 and the secondary interconnect 17.

It should be appreciated that in embodiments, any one or more of the links described may include direct connections or indirect connections or coupling between the respective elements.

Some embodiments may provide memory management on system on chips SoCs in order to enhance reliability. In some embodiments, a mechanism is provided for automatically moving the contents of the less reliable memory to a more reliable memory. As will be described in more detail, the silicon characterizing data may be used in conjunction with on chip sensors. The on-chip sensors may include one or more of process, voltage, and temperature sensors. The pre-silicon or post-silicon characterization data of memories are used to generate a template or a set of information which defines the memory reliability behavior under different conditions.

The set of information indicates what the memory reliability is for a given one or more parameters. For example, the template may include information about the expected reliability when the voltage is at different values, information about the expected reliability when the temperature is at different values, and information about the expected reliability at different processing values.

This template or the set of information in conjunction with the information obtained from the one or more sensors may be used to estimate the memory reliability conditions. In some embodiments, a ranking mechanism is provided for the available memories based on, for example, the silicon characterization data and dynamic access profiling data. This can be used to predict memory failure in advance considering the usage of memories as well In some embodiments, the DMA portion or engine 24 ensures an efficient working of the overall application, and may have a low software overhead for maintaining the memory configuration and contents. A ranking module, which will be described in more detail later, may provide a mechanism for re-enabling faulty memory devices. This may improve the life cycle of the product.

In some embodiments, the die or area of silicon is partitioned based on voltage regions or islands. In alternative embodiments, other criteria may be used in order to define different regions. Reliability monitors may be provided in each region. These may be process-voltage-temperature (PVT) sensors. The unreliability of the die regions may be dynamically computed during the runtime of the application with no overhead on the running firmware or software. In some embodiments, there may be no penalty on the CPU performance.

In embodiments, unreliable memories are remapped to reliable memories. In particular, the unreliable memory may be an entire memory or a portion of a memory.

Figure 2:
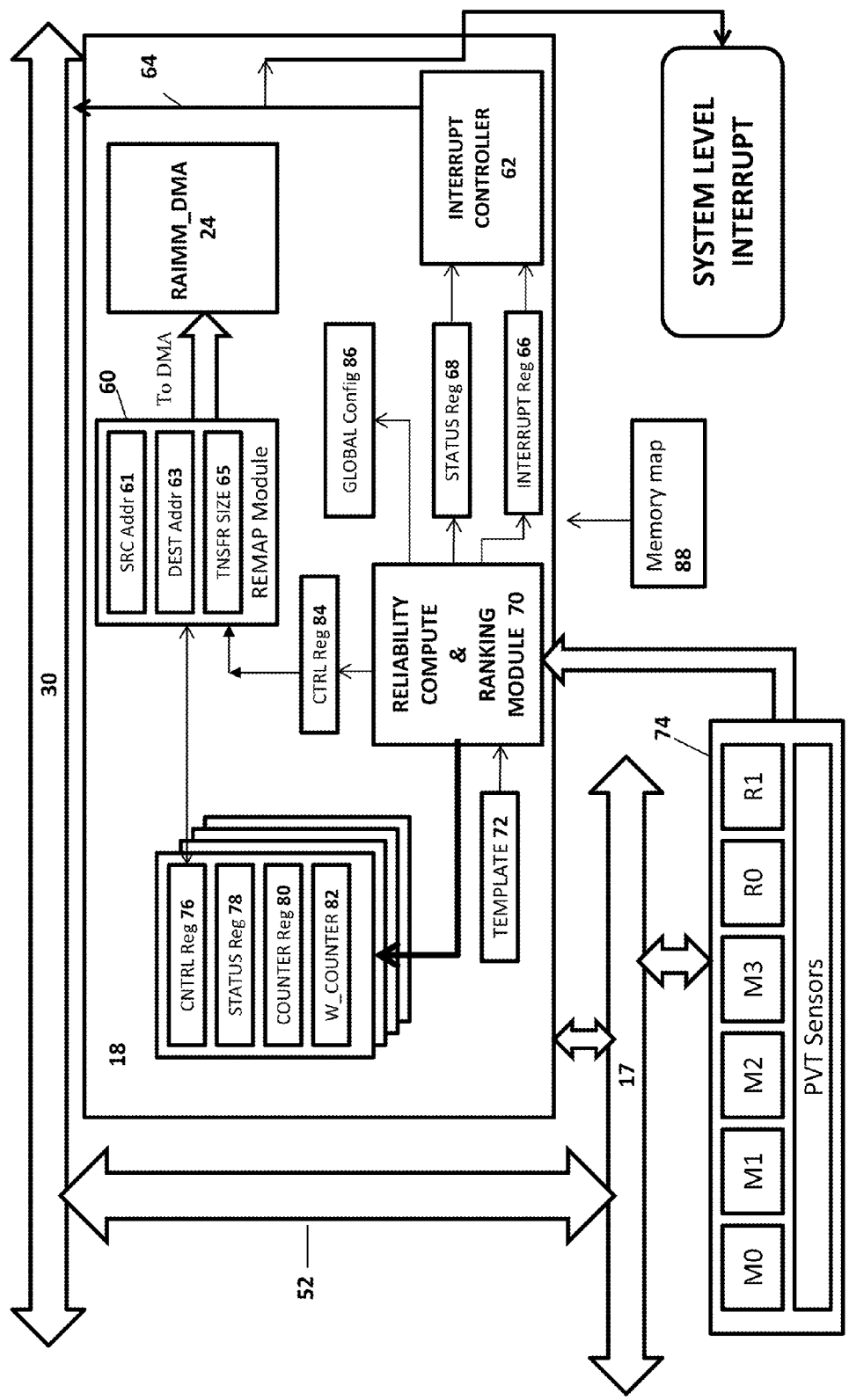
FIG. 2 shows a memory management module of FIG. 1 in more detail, according to an embodiment.

Reference is now made to FIG. 2, which shows the memory management module 18 in more detail, according to an embodiment. As with FIG. 1, the memory management module 18 is shown with the DMA portion 24. The DMA portion may be initially configured through software. The control and configuration of the DMA functionality may be via the RAIMM portion. The DMA function may perform only memory to memory operations. As will be described in more detail later, the RAIMM sends the source address, destination address, and transfer size along with the DMA enable bit through the DMA target port. When the enable bit is set in the DMA configuration register, the DMA starts to perform memory to memory data copying operations. Once the remapping operation is complete, the DMA sends a signal to the RAIMM to update the address map.

It should be appreciated that the remainder of the blocks shown in the memory management module 18 of FIG. 2 can be considered to be part of the RAIMM portion 26.

The RAIMM portion 26 has a re-mapping module 60. This re-mapping module 60 provides an output to the DMA portion 24. The re-mapping module 60 has information about a source address register 61, a destination address register 63, and the transfer size register 65. The source address register 61 stores the address of unreliable memory. The destination address register 63 stores the address of the available redundant memory. The redundant memory is memory which can be used for the contents of the unreliable memory. The transfer size register 65 stores the transfer size of the data to be transferred from the unreliable memory to the available redundant memory.

In embodiments, an SRAM is split into smaller instances s. These are the RAM modules 2, 4, 6 and 8 in FIG. 1. Alternatively or additionally, embodiments may be used with any other suitable memory. The large RAM is split into smaller RAM modules chunks and one or more redundant RAM modules are added. The redundant RAM modules are used for remapping of unreliable RAM modules.

An interrupt controller 62 is provided to generate system level interrupts. In particular, the interrupt controller 62 provides output interrupts 64. The interrupts 64 may be provided to a system level interrupt or another block on the SoC. The interrupt controller 62 receives an output from an interrupt register 66 and a status register 68. The status register 68 includes information on the memory status. For example, the memory status may be unreliable, less reliable, and reliable. The interrupt status register 66 may provide interrupt status information. The interrupt status information may be unreliable and less reliable.

A memory placement map may be used to correlate with the PVT (process, voltage, temperature) sensor information. In some embodiments, memory profiling may be based on usage. An application may decide which RAM address range has more critical data. The RAIMM module may compute a memory access profile to estimate which memory modules are most referenced. This memory profiling information along with the memory reliability information helps in creating a ranking table. In some embodiments, there may be dynamic computing of ranking of memories. A reliability computing and ranking module 70 is provided. The reliability computing and ranking module 70 provides an output to the status register 68 and the interrupt register 66.

The reliability computing and ranking module 70 is arranged to receive an input from a reliability template 72 or a set of information. The reliability template 72 can be considered to be a reliability matrix provided during initialization of the system. It is created based on pre-silicon or post-silicon characterization of the memories. The template may need to be generated for different type of memories or different semiconductor technologies. The reliability module 70 is a mathematical module to predict the reliability of the particular region of memory based on a given measurement(s).

The reliability computing and ranking module 70 also receives an input from one or more sensors 74. The sensors 74 may measure one or more of on chip process, voltage, and temperature. In some embodiments, the temperature sensor or sensors will provide information on local temperature variation due to high switching. The process sensor will provide information on intra-die variation of transistor threshold voltage values ($V_T$). The voltage sensor may provide voltage information. The voltage sensor measures the voltage being used. Based on the information coming from process/voltage/temperature sensors, the RAIMM module 26 provides a memory ranking table. The application software may use this information to reduce the voltage or to reduce the frequency to lower the temperature in a given memory in order to increase its reliability. This is known as voltage/frequency scaling. In embodiments, intra die process variation and intra die temperature variation are considered.

The reliability computing and ranking module 70 also provides a memory ranking table based on reliability. This ranking will be described in more detail later. However, use may be made of a reliability map of the die partitions. The ranking module may take into account memory placement versus die partitions. Each die partition will have its own PVT sensor(s). Therefore the ranking module will know which memories are placed in which die partition to correctly correlate the memory ranking versus PVT values. The memory ranking table may also take into account memory profiling for critical content, user input and prioritization, and hardware counters. The user can provide his own input to define critical memory content. The RAIMM module 26 may also do the same by periodically profiling the memory accesses. This way the RAIMM is able to know which memories are critical or most frequently used, and then, accordingly, the reliability ranking for such memories can be elevated compared to those memories which are not used at all, or less frequently used.

The reliability computing and ranking module 70 is configured to provide output information to a control register 76, a status register 78, a counter register 80, and a warning counter 82. The warning counter counts the memory accesses made to a particular memory module and provides profiling information. The counter register 80 includes read transaction counters and write transaction counters.

The re-map module 60 is arranged to receive an output from the control register 76.

The reliability computing and ranking module 70 also provides an output to a second control register 84, the output of which again is provided to the re-map module 60. The control register 84 provides the enable output which can enable or disable the DMA portion 24.

The reliability computing and ranking module 70 provides an output to a global configuration register 86. The configuration register 86 has RAIMM enable/disable, interrupt enable/disable, and memory configuration information. This includes information on the redundant portion of the memory.

Information on a memory map 88 is also provided to the RAIMM 26. In particular, this information may be provided to the reliability computing and ranking module 70.

The RAIMM 26 can continuously monitor the reliability of the system memory due to process, voltage, or temperature variation. Memory profiling based on the accesses to the memory is also provided. The memories are ranked based on the process, voltage, or temperature conditions and the memory profiling. The module further provides remapping of unreliable memory data into reliable memory. Alternatively, as discussed previously, voltage/frequency scaling may be provided. Furthermore, system level interrupts may be provided for unreliable memories.

In embodiments, a physical address from a less reliable memory module is mapped to a logical address in a more reliable memory module. In embodiments, during the system on chip architecture definition, the large memory may be split into several smaller modules.

During runtime, the memory ranking table is continuously updated. In the event of any alert, the RAIMM module 26 is configured to provide an interrupt to the system to copy the contents from an unsafe memory to a safer memory. Alternatively or additionally, a DMA mechanism may be provided to copy the memory contents. The memory ranking table is used to remap the address region. Dynamic voltage scaling may alternatively or additionally be used to increase the reliability of an unsafe region. In other words, the voltage used in the memory is increased. Generally, this will result in more reliability in that memory.

The reliability ranking module 70 is now described in more detail. This module 70 continuously computes the reliability status of the system memory taking input from the sensors in the system memory. The ranking module may have predefined ranking table logic with reference values. This is the reliability template. These values can be obtained in any suitable manner and in some embodiments may be Monte Carlo simulation values. In some embodiments, the reference value will include all of the corner cases for a particular technology. In other words, this takes into account the worst case scenario for a particular technology.

The reliability ranking module may use a 2 stage computation in order to get the reliability status of the system memory. In the first stage, the reliability status of individual process, voltage, and temperature variations are checked. The outputs of the first stage are then used in a second stage in order to give a final reliability status of the system memory. The reliability ranking module 70 may have four ranking portions. One respective portion is for each of voltage, process, and temperature. The final portion is a final decision ranking table which decides the final reliability.

Figure 3A:
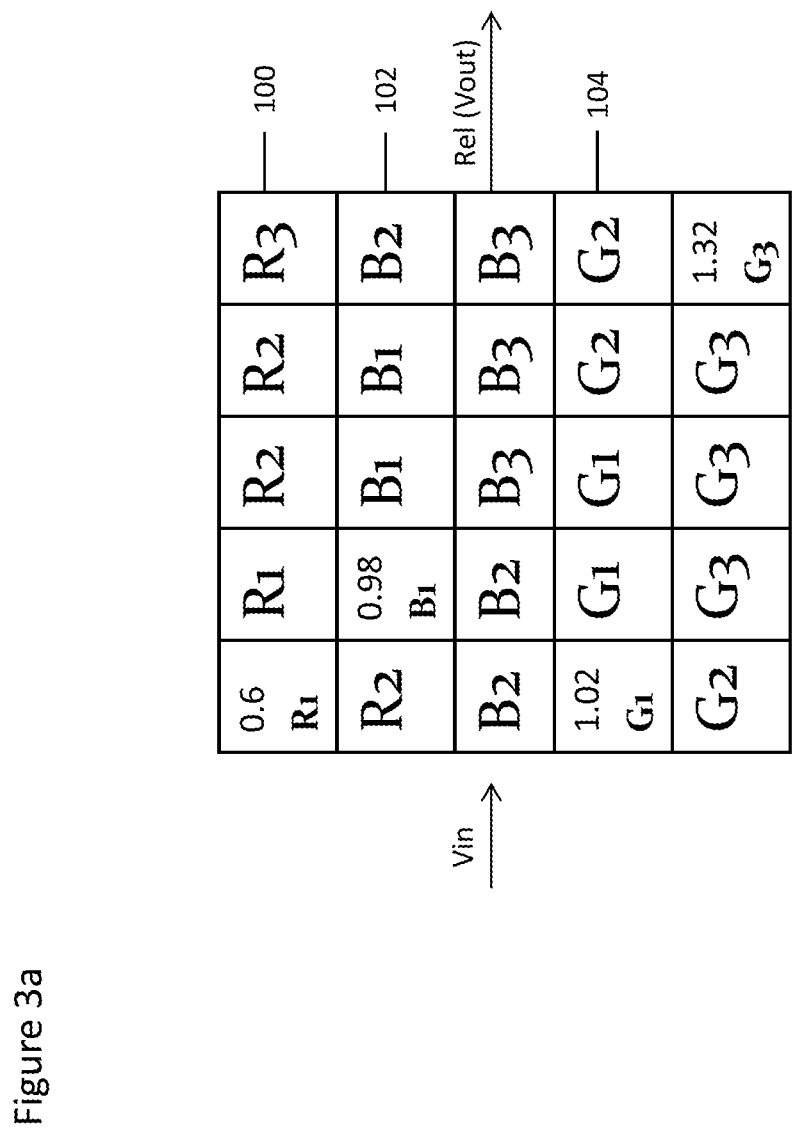
FIG. 3a shows a ranking table for voltage variation, according to an embodiment.

Reference is now made to FIG. 3A, which shows the ranking table for voltage variation, according to an embodiment. This table decides the reliability of the system memory with respect to voltage variation. A total of nine possible outputs are provided in this example. This example uses a color code for different voltage corner cases. The example table shown in FIG. 3A has 25 options. The number of options is by way of example only, and more or less than 25 options may be provided in alternative embodiments. The number of outputs is also by way of example.

Each of the 25 options will represent a particular voltage or range of voltages. Additionally, the 25 options are divided into three categories. For convenience, these categories are referred to as red, blue and green. However, this is by way of example only, and the different regions may be referred to by any other suitable name. In the example shown in FIG. 3a, the table is visualized as having five rows with five options. However, this is one way of representing the information, and any other suitable way of representing and storing the information may be used. The values for the voltage increase across the rows and down the columns. Accordingly, the first entry is the lowest option and in this example is 0.6 V. The last entry is the highest voltage and is 1.32 Volts. In this example, the first six entries are associated with the red category. This category has entries for increasing the voltages up to but not including 0.98 V. The blue region has nine entries and starts with 0.98 V and goes up to but not including 1.02 V. The green region of the table has 10 entries and goes up to 1.32 volts. It is appreciated that the number of entries for each category can of course be varied. It is also appreciated that if the voltage is outside 0.6 V to 1.32 V, the default entry will be red. In some embodiments, the output of the table will therefore be red, blue, or green. It is appreciated that the voltage values are by way of example only, and different embodiments may use different voltage values. The voltage values used may be dependent on one or more of the semiconductor technology as well as on the memory design.

In some embodiments, each of the three categories may be further divided into three categories. Accordingly, the first two entries of the table are categorized as R1, the third and fourth as R2, and the fifth and sixth as R3. In the blue category, the first three entries are categorized as B1, the second three entries as B2, and the third three entries as B3. As far as the green category is concerned, the first three entries are considered to be G1, the second three entries are considered to be G2, and the remaining four entries as G3. It is appreciated that each of the categories can be subdivided into none, one, two, or more than three categories. Additionally, the number of entries for each subcategory may be the same or different within each category.

The subdivisions of the categories may provide for a finer categorization.

Figure 3B:
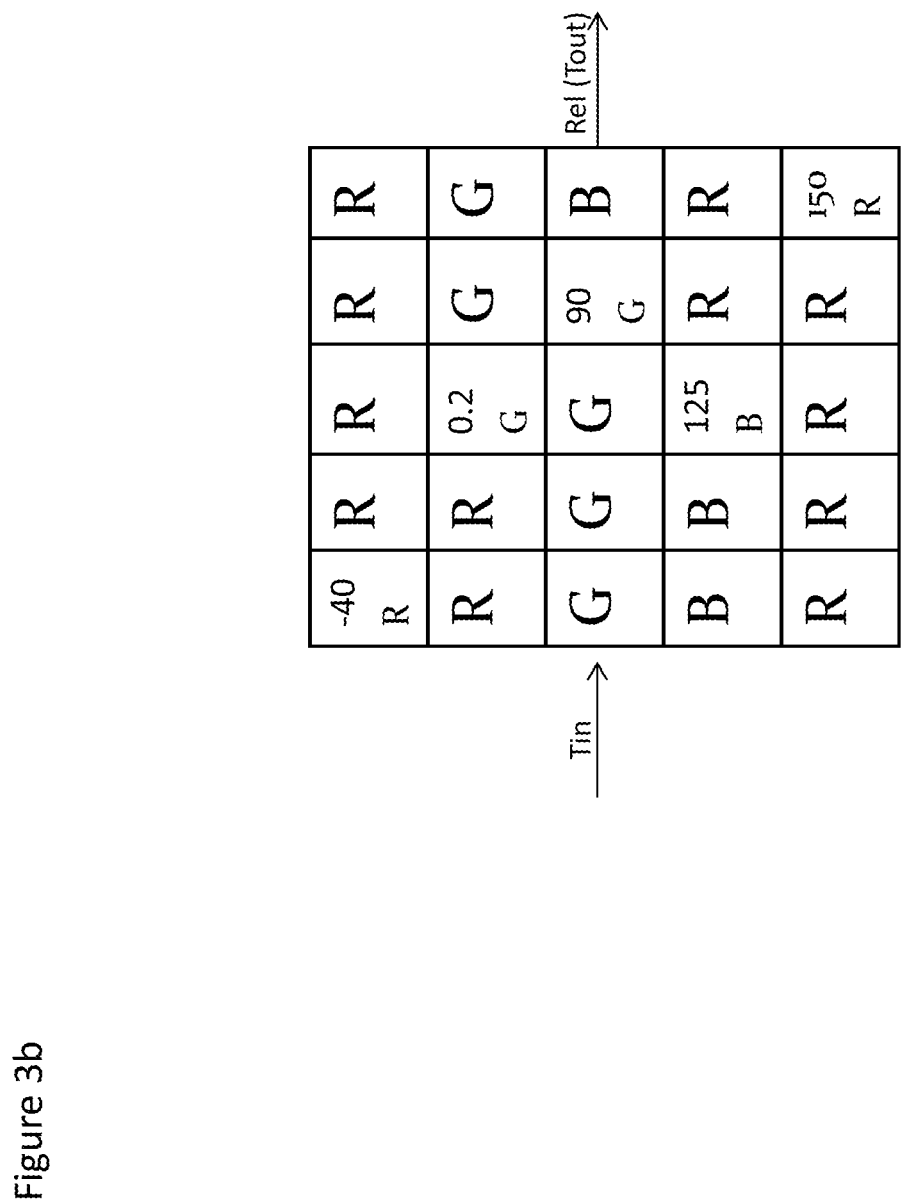
FIG. 3b shows a ranking table for temperature variation, according to an embodiment.

Reference is now made to FIG. 3b, which shows the ranking table for temperature variation. This table provides reliability information for the system memory with respect to temperature variation. Again, the predefined reference values may be taken from a Monte Carlo simulation. In some embodiments, the table will include all suitable corner cases. In the example shown in FIG. 3b, the temperature variation is between −40° C. to 150° C. Again, the ranking table for the temperature variation is represented visually by a table of five rows by five columns. The table is again categorized into three different categories. Again, for convenience, the three categories are referenced red, blue, and green. However, this is again by way of example, and the different categories can of course be named differently. Again, the temperature increases across rows and down columns. The lowest temperature of −40° C. is represented by the first entry of the first row. The highest temperature of 150° C. is represented by the last entry of the last row. The first six entries of the table and the last six entries of the table are the red category. The green entries are the seven entries after the first group of red entries. The blue entries are the remaining entries. The red categorization will cover temperatures from −40° C. to 0.1° C. The green category is used from temperatures from 0.2° C. to 90° C. The blue category is from 90° C. to 125° C. Above 125° C., then the category is red. It is appreciated that if the temperature is outside the range of −40° C. to 150° C., then the output would be red.

It is appreciated that none, or one or more of the three categories, may be subdivided into two or more subcategories as discussed previously.

Figure 3C:
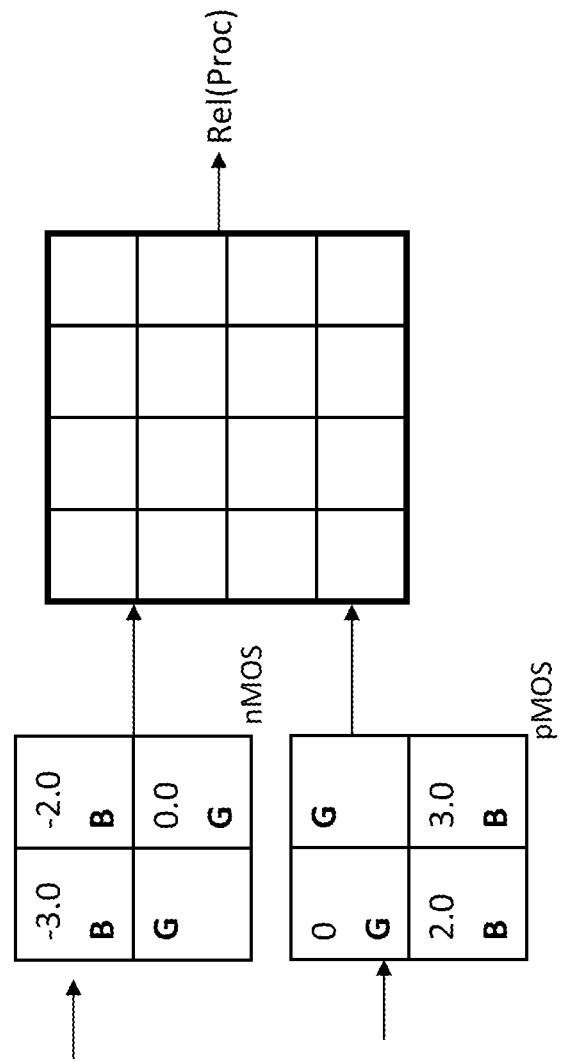
FIG. 3c shows ranking tables for process variation, according to an embodiment.

Reference is now made to FIG. 3c, which shows a ranking table for process variation. For process variation, a first table is provided for NMOS and a second table is provided for PMOS. The first two entries of the NMOS table can be considered to be blue entries whilst the second two entries for the NMOS table can be considered to be green. For the PMOS table, the first two entries can be considered to be green and the second two entries can be considered to be blue. In this example, the NMOS and PMOS tables each have four entries arranged in two rows of two. As far as the NMOS table is concerned, if the value is −2.0 to 0.0, then the entry is considered green. If the value is −3 to −2.0, then the entry is considered blue. In this example, the units are Six-Sigma levels.

As far as the PMOS table is concerned, if the value is from 0 to 2, then the entry is considered to be in the green category. If the entry is from 2 to 3, then the entry is considered to be blue. Outside the defined ranges, then the output is categorized as red. The outputs of each of the PMOS and NMOS tables are input to a second stage that decides final reliability for process variation using the first stage output combinations. The second stage analyzes the 2-dimensional matrix formed by the information provided by PMOS and NMOS tables. It then computes a reliability category as is provided by the worst condition. If the PMOS value is green, and the NMOS value is blue, then the final result would be blue, and so on.

In an embodiment, the predefined reference values may be taken from a Monte Carlo simulation. In some embodiments a six-sigma process variation is simulated.

Figure 4:
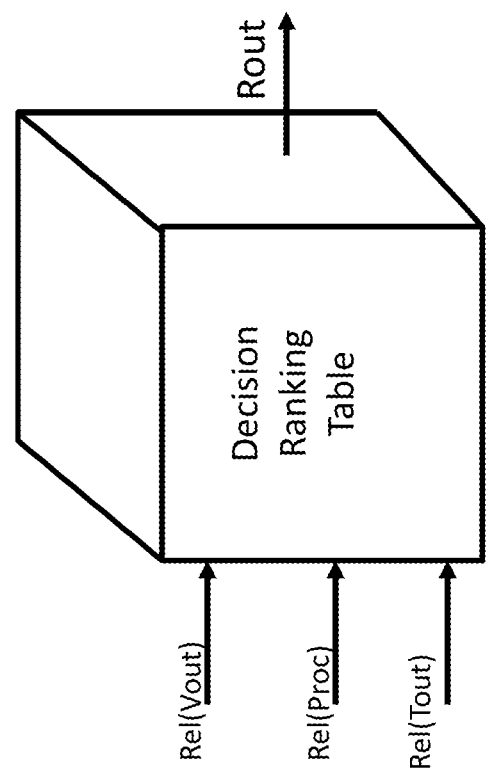
FIG. 4 shows a decision ranking table, according to an embodiment.

Reference is now made to FIG. 4, which shows the final decision ranking table. This decision ranking table decides the final reliability with respect to the process, voltage, and temperature variations. The decision ranking table receives the outputs of each of the tables are shown in FIGS. 3a, 3b and 3c. In some embodiments, the outputs of each of the tables shown in FIG. 3 can be considered to be one of three different categories: unreliable, less reliable, and reliable. Again, this naming is arbitrary and different naming conventions can be used in other embodiments. The unreliable output can be considered to be a red output, a less reliable output can be considered to be a blue output, and a green output can be considered to be a reliable output.

The decision-making table will use these inputs to provide an output. Different rules can of course be applied by the decision ranking table. In an embodiment, if any one of the inputs is unreliable, then the output is unreliable. If the voltage is reliable and the process and temperature are less reliable, then the output is reliable. If the voltage is less reliable, then the output is less reliable.

Figure 6:
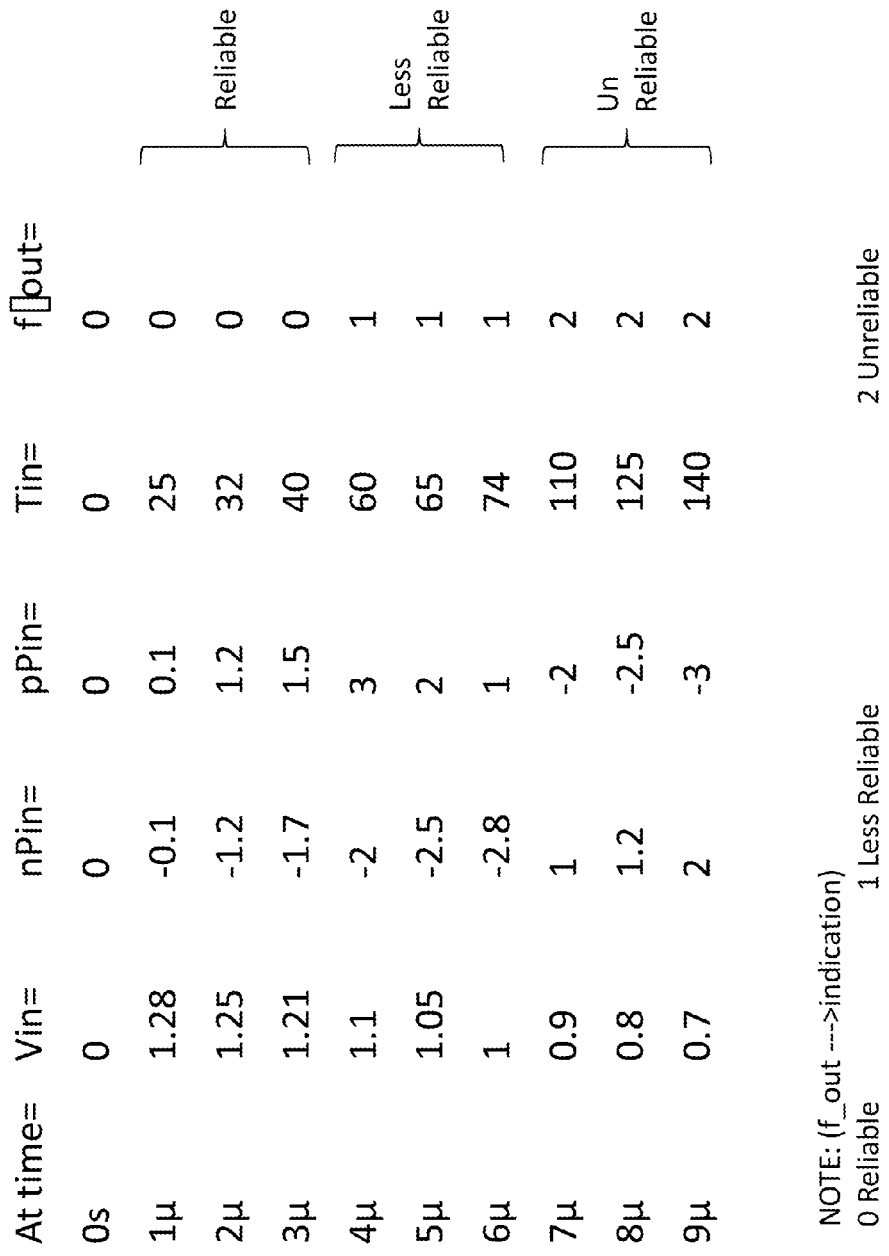
FIG. 6 shows an example of ranking module behavior, according to an embodiment.

By way of example of only, reference is made to FIG. 6, which shows an example of ranking module behavior. The ranking module behavior shows the behavior of a particular memory region. Each row of the table represents the behavior at a particular time. Accordingly, the first column shows the particular instance in time. In particular, the table shows the behavior at one microsecond intervals from time t=0 μs to t=9 μs. The second column shows the voltage values detected by the voltage sensor at the respective time intervals. As can be seen, the voltage values are reliable up to t=3 μs. For the measurements at 4 μs to 6 μs, the reliability is the intermediate reliability. Finally, the final three voltage readings indicate that the memory region is unreliable.

The third and fourth columns show the process variation respectively for nMOS and pMOS. In the nMOS example, the readings for 1 μs, 2 μs, and 3 μs are reliable, the readings for 4 μs, 5 μs, and 6 μs have the intermediate reliability and the remaining readings are unreliable.

For the pMOS conditions, the readings for 1 μs, 2 μs, 3 μs, 5 μs, and 6 μs are reliable readings, the reading for 4 μs is of intermediate reliability, and the remaining meetings are unreliable.

The next column shows the temperature. The measurements up to and including the measurement at 6 μs are all reliable. The reading at 7 μs is of intermediate reliability, and the remaining readings are unreliable.

The final column shows the output which is provided, for example, by the decision ranking table of FIG. 4. This indicates that the memory region is reliable up to 3 μs. From 4 μs to 6 μs, the memory region is considered to be less reliable. Finally, for the remaining readings, the memory region is considered unreliable.

It should be appreciated that in some embodiments, the mechanism is a dynamic mechanism. In particular, the memory region can have its reliability change over time. The reliability of the memory region is dependent on the operating conditions. Accordingly, the same memory region may, over time, be of different reliabilities. It is appreciated that the reliability of the memory region may change in use. For example, the memory region may go from being reliable to unreliable and back to being reliable, whilst the memory is being used.

Figure 5:
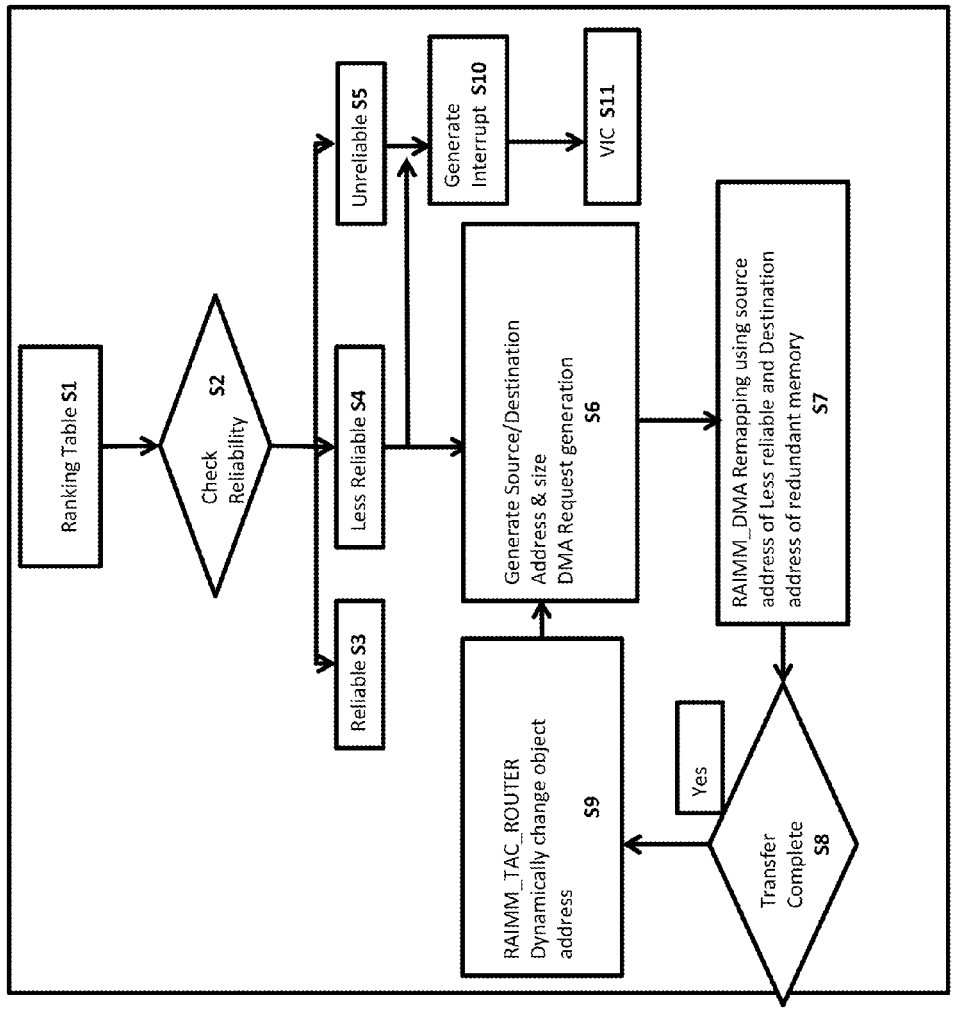
FIG. 5 show a flow diagram for part of the memory management module, according to an embodiment.

Reference is made to FIG. 5 which shows a flowchart of an embodiment. In step S1, inputs are provided to the respective P, V, and T tables, the outputs of which are provided to the final decision ranking table.

In step S2, the reliability of the output of the final decision table is checked.

In the next step S3, if the output of the final decision table is considered reliable, then no change in operation is considered necessary.

If the reliability is considered to be less reliable, the then next step is step S4.

This is followed by step S6, which generates source/destination addresses and size information. This may be done by the remapping module. A DMA request is generated. In addition, the less reliable output of step S4 is followed by step S10 where an interrupt is generated.

In step S7, remapping takes place using the source address of the less reliable memory and the destination address of redundant memory.

In step S8, a determination is made as to whether or not the remapping or transfer has been completed.

If so, the next step is step S9. The router will dynamically change the object address. This may be followed again by step S6 if there are further areas of the memory to remap.

If the check for reliability of step S2 considers the reliability to be unreliable, then the next step is step S5 of the flow.

The next step is step S10 and as previously described.

In step S11, the VIC processes the interrupt and provides information to the CPU to branch to its vector location. The interrupt service routine can then take necessary actions to prevent application failure.

The above described embodiments have been in the context of a system on a chip (SOC). In some embodiments, the RAIMM and the one or more memories maybe on different dies or integrated circuits.

In the above examples, the specific values disclosed are by way of example, and different values may be used in other embodiments.

In the above examples, three categories of reliability may be used. In some embodiments, only two categories of reliability are used, and in other embodiments, more than three categories of reliability are provided.

Some embodiments may be used with one or more dies. The one or more memories maybe one or more dies. The RAIMM may be on the same or different die to the memory. The functionality of the RAIMM may be on one die or divided across one or more dies.

In the described embodiments, a plurality of random access memories are provided. These memories may be separate memories or different parts of one or more additional redundant memories.

In alternative embodiments, the memories may be any other suitable type of memory/memories to the RAMs described.

Embodiments may be applied in a wide range of technologies and applications. For example, embodiments may be used in a set top box, a Digital Television (DTV), automotive applications, microcontroller and microprocessor applications, and an application processor in a multimedia convergence application. Embodiments may be used in communications devices such as mobile phones, smart phones, tablets, or the like. While this detailed description has set forth some embodiments, it covers other embodiments that differ from the described embodiments according to various modifications and improvements. Other applications and configurations may be apparent to the person skilled in the art. Some of the embodiments have been described in relation to a number of masters and a DDR controller. It should be appreciated that this is by way of example only, and the target may be any suitable entity. Alternative embodiments may use any suitable interconnect instead of the example Network-on-Chip.

Moreover, any of the functions described above may be performed in hardware, firmware, software, or in a combination or subcombination of hardware, firmware, and software.

In addition, the above-described integrated circuit may be coupled to at least one other integrated circuit to form a system, where one or more of the integrated circuits may be, for example, a computing circuit such as a microprocessor or microcontroller. The integrated circuits may be disposed on a same die (e.g., a system on a chip), or on respective dies.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A memory manager circuit, comprising:
an input node configured to receive sensor information regarding a region of an integrated circuit; and
a reliability aware intelligent memory management circuit configured to determine a likelihood that the region will cause an error to data stored in the region, the likelihood being determined using a ranking table based on the sensor information and on reliability information defining reliability of data storage in the region under different operating conditions, the ranking table including a plurality of sensed-parameter tables, each sensed-parameter table being associated with a sensed parameter of the region where each sensed parameter is part of the sensor information, and the ranking table further including a final decision table that determines a final reliability parameter for the region using all of the sensed-parameters.

2. The memory manager circuit of claim 1 wherein the ranking table comprises a plurality of sensed-parameter tables, each sensed-parameter table being associated with a sensed parameter of the region, and the ranking table further comprising a final decision table that determines a final reliability for the region with respect to all of the sensed-parameters.

3. The memory manager circuit of claim 1 wherein the sensor information includes a temperature of the region.

4. The memory manager circuit of claim 1 wherein the sensor information includes a supply voltage for memory circuitry disposed in the region.

5. The memory manager circuit of claim 1 wherein the information includes a physical attribute of the region.

6. The memory manager circuit of claim 1 wherein the sensor information includes process-voltage-temperature attributes of the region.

7. The memory manager circuit of claim 1, further comprising:
wherein the region includes a memory array that stores the data of the region; and
a mapping circuit configured to transfer data contents of the memory array to another memory array in response to the reliability aware intelligent memory management circuit determining that the likelihood that the memory array will cause an error to the data is greater than the likelihood the other memory array will cause an error to the data.

8. The memory manager circuit of claim 1, wherein the mapping circuit is further configured to generate an interrupt in response to the reliability control circuitry determining that the likelihood that the region will cause an error to the data is greater than a likelihood threshold.

9. An integrated circuit, comprising:
a region including a memory configured to store data; and
a memory manager circuit including,
an input node configured to receive sensor information regarding the region; and
a reliability aware intelligent memory management circuit configured to determine a level of reliability of the region, the level of reliability being determined using a ranking table based on the sensor information and on reliability information defining reliability of data storage in the region under different operating conditions, the ranking table including a plurality of sensed-parameter tables, each sensed-parameter table being associated with a sensed parameter of the region and each sensed parameter being part of the sensor information, and the ranking table further including a final decision table that determines a final reliability parameter for the region using all of the sensed-parameters.

10. The integrated circuit of claim 9 wherein the ranking table comprises a plurality of sensed-parameter tables, each sensed-parameter table being associated with a sensed parameter of the region, and the ranking table further comprising a final decision table that determines a final reliability for the region with respect to all of the sensed-parameter.

11. The integrated circuit of claim 9 wherein the sense-parameter tables include a temperature table, voltage table, and process table.

12. The integrated circuit of claim 9, further comprising:
wherein the memory manager circuit includes an interrupt generator that is configured to generate an interrupt in response to the reliability aware intelligent memory management circuit determining that the level of reliability of the region has a relationship to a reliability threshold; and
an interrupt handler configured to execute an interrupt-service routine in response to the interrupt.

13. The integrated circuit of claim 9, further comprising:
a first memory array disposed in the region;
a second memory array; and
wherein the memory manager circuit includes a memory handler configured to transfer contents of the first memory array to the second memory array in response to the reliability aware intelligent memory management circuit determining that the level of reliability of the region has a relationship to a reliability threshold.

14. A system, comprising:
a first integrated circuit including, a region including a memory configured to store data, and a memory manager circuit including,
an input node configured to receive sensor information regarding the region, and
a reliability aware intelligent memory management circuit configured to determine a level of reliability of the region, the level of reliability being determined using a ranking table based on the sensor information and on reliability information defining reliability of data storage in the region under different operating conditions, the ranking table including a plurality of sensed-parameter tables, each sensed-parameter table being associated with a sensed parameter of the region and each sensed parameter being part of the sensor information, and the ranking table further including a final decision table that determines a final reliability parameter for the region that is based on all of the sensed-parameters; and
a second integrated circuit coupled to the first integrated circuit.

15. The system of claim 14 wherein the first and second integrated circuits are disposed on a same die.

16. The system of claim 14 wherein the first and second integrated circuits are disposed on respective dies.

17. The system of claim 14 wherein at least one of the first and second integrated circuits includes a computing circuit.

18. The system of claim 14, further comprising:
wherein the memory manager circuit includes an interrupt generator that is configured to generate an interrupt in response to the reliability aware intelligent memory management circuit determining that the level of reliability of the region has a relationship to a reliability threshold; and
an interrupt handler configured to execute an interrupt-service routine in response to the interrupt.

19. The system of claim 14, further comprising:
a first memory array disposed in the region of the first integrated circuit;
a second memory array disposed in a region of the second integrated circuit; and
a memory handler configured to transfer contents of the first memory array to the second memory array in response to the reliability aware intelligent memory management circuit determining that the that the level of reliability of the region has a relationship to a reliability threshold.

20. A method, comprising:
receiving sensor information regarding a region of an integrated circuit; and
determining a level of reliability of the region, the level of reliability being determined using a ranking table based on the sensor information and on reliability information defining reliability of data storage in the region under different operating conditions.

21. The method of claim 20 wherein the ranking table comprises a plurality of sensed-parameter tables, each sensed-parameter table being associated with a sensed parameter of the region, and the ranking table further comprising a final decision table that determines a final reliability for the region with respect to all of the sensed-parameters.

22. The method of claim 21 wherein the region includes a memory array.

23. The method of claim 21, further comprising:
wherein the region includes a memory array; and
transferring contents of the memory array to another memory array in response to the level of reliability having a relationship to a reliability threshold.

24. The method of claim 21, further comprising generating an interrupt in response to the level of reliability having a relationship to a reliability threshold.

25. A non-transitory computer-readable medium storing instructions that, when executed by at least one computing apparatus, cause the at least one computing apparatus, or another apparatus coupled to the at least one computing apparatus:
to receive sensor information regarding a region of an integrated circuit; and to determine a level of reliability of the region, the level of reliability being determined using, a ranking, table based on the sensor information and on reliability information defining reliability of data storage in the region under different operating conditions, the ranking table including a plurality of sensed-parameter tables, each sensed-parameter table being associated with a sensed parameter of the region and each sensed parameter being part of the sensor information, and the ranking table further including a final decision table that determines a final reliability parameter for the region that is based on all of the sensed-parameters.

* * * * *

UNITED STATES PATENT AND TRADEMARK OFFICE
CERTIFICATE OF CORRECTION

PATENT NO. : 9,142,322 B2  Page 1 of 1
APPLICATION NO. : 13/964299
DATED : September 22, 2015
INVENTOR(S) : Deepak Baranwal et al.

It is certified that error appears in the above-identified patent and that said Letters Patent is hereby corrected as shown below:

In the Claims

Column 12, Line 44:
"for the region with respect to all of the sensed-parameter." should read, --for the region with respect to all of the sensed-parameters.--.

Column 13, Line 43:
"management circuit determining that the that the level of" should read, --management circuit determining that the level of--.

Column 14, Line 33:
"using, a ranking, table based on the sensor information" should read, --using a ranking table based on the sensor information--.

Signed and Sealed this
Twelfth Day of July, 2016

Michelle K. Lee
*Director of the United States Patent and Trademark Office*